(12) United States Patent
Tsou et al.

(10) Patent No.: US 11,284,505 B2
(45) Date of Patent: Mar. 22, 2022

(54) PRINTED CIRCUIT BOARD AND MOTHERBOARD WITH THE SAME

(71) Applicant: ASUSTEK COMPUTER INC., Taipei (TW)

(72) Inventors: Ping-Han Tsou, Taipei (TW); Li-Chien Wan, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/876,981

(22) Filed: May 18, 2020

(65) Prior Publication Data

US 2020/0375021 A1    Nov. 26, 2020

(30) Foreign Application Priority Data

May 24, 2019 (TW) .................................. 108118150

(51) Int. Cl.
*H05K 7/00* (2006.01)
*H05K 1/02* (2006.01)
*H05K 1/18* (2006.01)

(52) U.S. Cl.
CPC ........... *H05K 1/0218* (2013.01); *H05K 1/181* (2013.01); *H05K 2201/0715* (2013.01); *H05K 2201/10159* (2013.01); *H05K 2201/10189* (2013.01); *H05K 2201/10272* (2013.01)

(58) Field of Classification Search
CPC ................. H05K 1/0218; H05K 1/181; H05K 2201/10272; H05K 2201/10189; H05K 2201/10159; H05K 2201/0715; H05K 2201/0195; H05K 2201/0215;
(Continued)

(56) References Cited

U.S. PATENT DOCUMENTS 5,537,116 A * 7/1996 Ishino .................... H01Q 17/00
342/1
7,154,761 B1 * 12/2006 Camerlo .............. H05K 1/0263
361/788
(Continued)

FOREIGN PATENT DOCUMENTS

CN     106538086 A    3/2017
CN     108300360 A    7/2018
(Continued)

OTHER PUBLICATIONS

"What is Solder Mask(S/M)? What is the Use for PCB? is It Only Green?," Posted by Working Bear on Dec. 7, 2017, https:/www.researchmfg.com/2017/07/soldermask/, retrieved Dec. 31, 2020 (with English translation), 3 pages.
(Continued)

*Primary Examiner* — Yuriy Semenenko
(74) *Attorney, Agent, or Firm* — Muncy, Geissler, Olds & Lowe, PC

(57) ABSTRACT

A printed circuit board comprising a main body, a first insulation layer, and an anti-electromagnetic interference (EMI) coating is provided. The first insulation layer covers the main body and comprises a predetermined area. The anti-EMI coating covers the predetermined area, and comprises wave-absorption powders and an adhesive material. A motherboard with the printed circuit board is also provided.

9 Claims, 4 Drawing Sheets

(58) Field of Classification Search
CPC ......... H05K 2201/0323; H05K 3/3452; H05K 2201/0723
See application file for complete search history.

(56) References Cited

U.S. PATENT DOCUMENTS

| | | | | |
|---|---|---|---|---|
| 8,084,697 | B2* | 12/2011 | Chen | H05K 9/002 174/382 |
| 2001/0033478 | A1* | 10/2001 | Ortiz | H01R 13/6599 361/818 |
| 2009/0182398 | A1* | 7/2009 | Kleyman | A61B 18/18 607/98 |
| 2011/0168440 | A1* | 7/2011 | Egami | B32B 5/022 174/377 |
| 2013/0016466 | A1* | 1/2013 | Yen | H05K 1/0216 361/679.02 |
| 2018/0177056 | A1* | 6/2018 | Chen | H05K 1/09 |
| 2018/0286815 | A1* | 10/2018 | Qi | H01L 23/49838 |
| 2019/0352543 | A1 | 11/2019 | Ghosh et al. | |
| 2020/0211975 | A1* | 7/2020 | Dhakal | H01L 23/3128 |
| 2021/0047518 | A1* | 2/2021 | Tsunematsu | C09C 1/00 |

FOREIGN PATENT DOCUMENTS

| | | |
|---|---|---|
| TW | 200622553 A | 7/2006 |
| TW | 201626865 A | 7/2016 |
| TW | 201840720 A | 11/2018 |
| WO | WO2015157987 A1 | 10/2015 |

OTHER PUBLICATIONS

Office Action issued in corresponding TW application No. 108118150 dated Jan. 8, 2021, 4 pages.

* cited by examiner

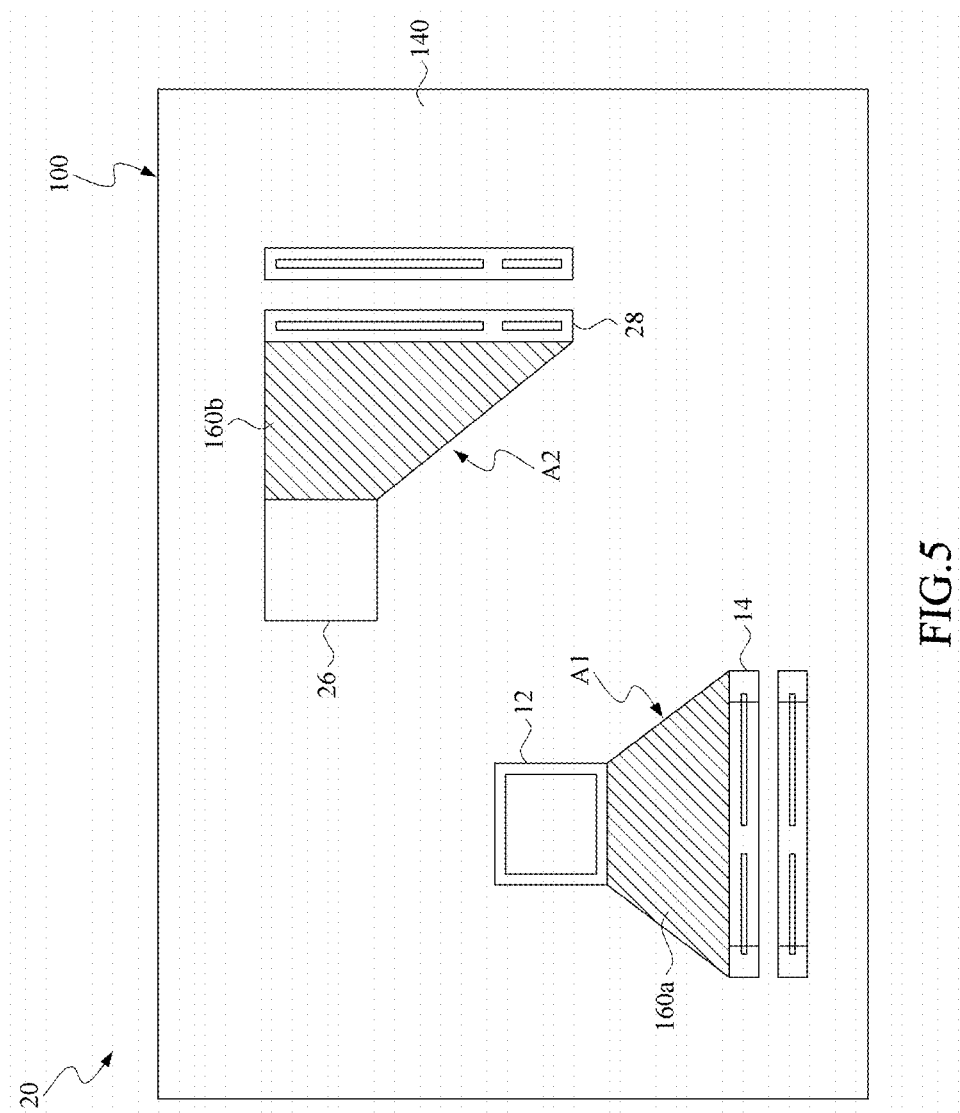

PRINTED CIRCUIT BOARD AND MOTHERBOARD WITH THE SAME

CROSS-REFERENCE TO RELATED APPLICATION

This application claims the priority benefit of Taiwan Application Serial No. 108118150, filed on May 24, 2019. The entirety of the above-mentioned patent application is hereby incorporated by reference herein and made a part of specification.

BACKGROUND OF THE INVENTION

Field of the Invention

The disclosure relates to a printed circuit board and a mother board with the printed circuit board, and in particular to, an anti-electromagnetic interference printed circuit board and a motherboard with the printed circuit board.

Description of the Related Art

The conventional anti-electromagnetic interference technologies are mainly for shielding electromagnetic signal sources, for example, integrated circuit chips and integrated circuit packages, to protect electronic components in electronic products. However, such anti-electromagnetic interference technologies are not applicable to open type circuit board products such as motherboards, graphics cards, and the like.

BRIEF SUMMARY OF THE INVENTION

The disclosure provides a printed circuit board. The printed circuit board includes a main body, a first insulation layer, and an anti-electromagnetic interference (EMI) coating. The first insulation layer covers the main body and includes a predetermined area. The anti-EMI coating covers the predetermined area and includes wave-absorption powders and an adhesive material.

The disclosure provides a motherboard. The motherboard includes a printed circuit board, a central processing unit slot, and a memory slot. The printed circuit board includes a main body, a first insulation layer, and an anti-EMI coating, where the first insulation layer covers the main body and includes a predetermined area, the anti-EMI coating covers the predetermined area and includes wave-absorption powders and an adhesive material, the central processing unit slot is disposed on the main body, and the memory slot is disposed on the main body.

A specific surface area of the printed circuit board and the motherboard provided by the disclosure are covered with an anti-EMI coating, and the anti-EMI coating includes wave-absorption powders and an adhesive material. The wave-absorption powders absorb electromagnetic waves to avoid interference caused by a transmission signal on the printed circuit board to other electronic components.

The specific embodiments used in the disclosure are further described with reference to following embodiments and accompanying drawings.

BRIEF DESCRIPTION OF THE DRAWINGS

FIG. 5 is a three-dimensional schematic diagram of another embodiment of a motherboard according to the disclosure.

DETAILED DESCRIPTION OF THE EMBODIMENTS

Specific embodiments of the disclosure are further described in detail below with reference to schematic diagrams. Features and advantages of the disclosure are more clear based on the following descriptions and claims. Accompanying drawings which are in simplified forms and are not drawn to scale are merely used for facilitating a clear understanding of the embodiments of the disclosure.

Figure 1:
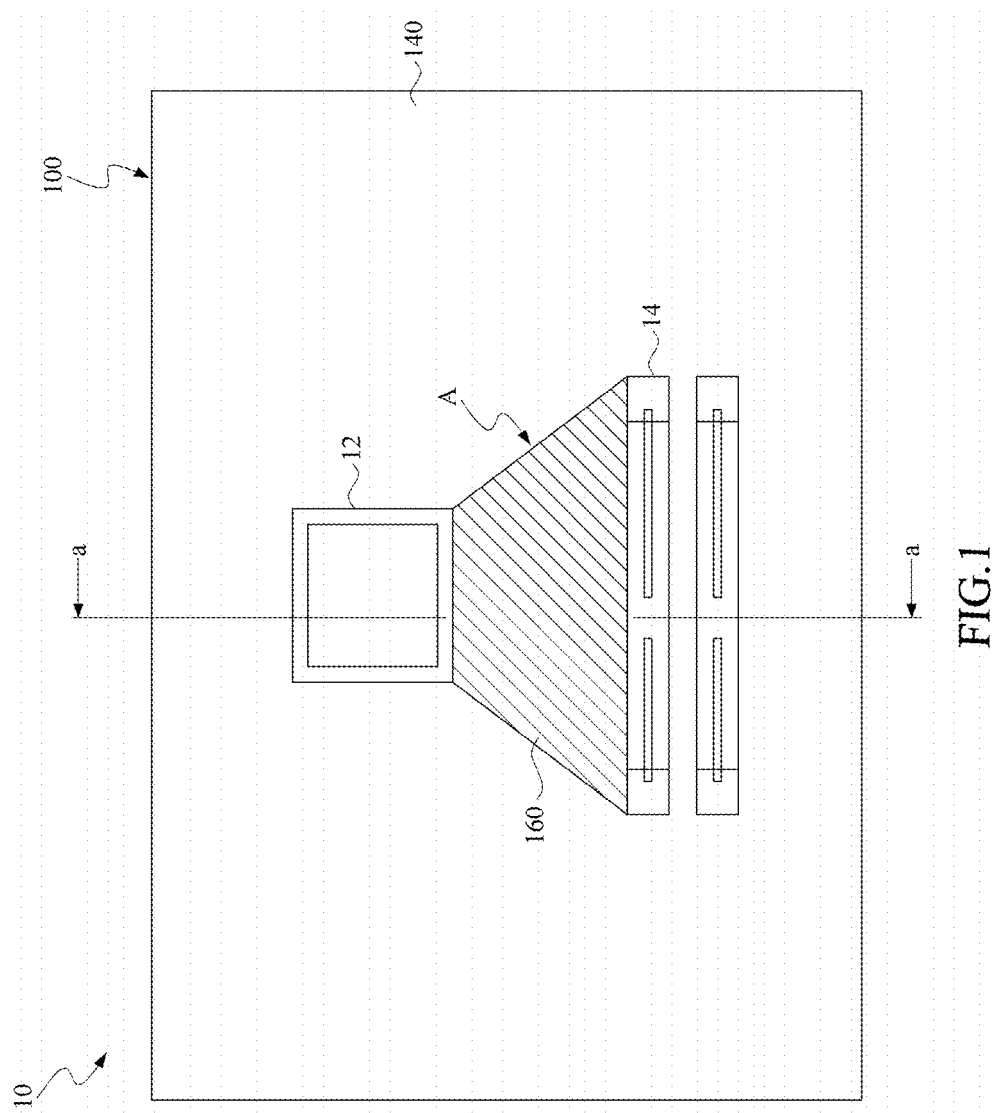
FIG. 1 is a three-dimensional schematic diagram of an embodiment of a motherboard according to the disclosure.
Figure 2:
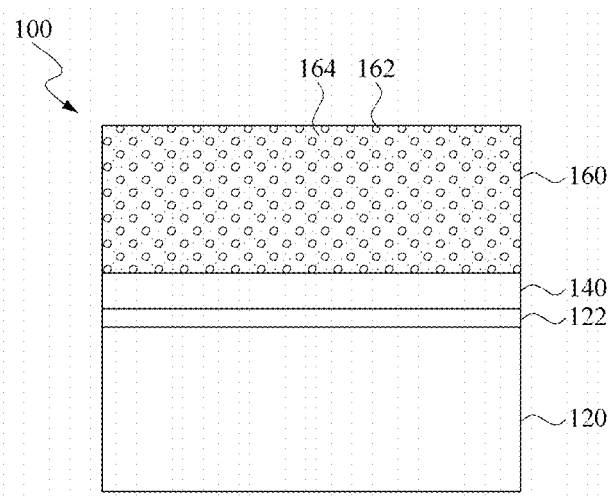
FIG. 2 is a cross-sectional schematic diagram of an embodiment of a printed circuit board according to the disclosure.

FIG. 1 is a three-dimensional schematic diagram of an embodiment of a motherboard according to the disclosure. FIG. 2 is a cross-sectional schematic diagram of an embodiment of a printed circuit board according to the disclosure, and the cross-sectional schematic diagram corresponds to an a-a cross-section in FIG. 1.

As shown in the figure, a motherboard 10 includes a printed circuit board 100, a central processing unit slot 12, and at least a memory slot 14. In an embodiment, two memory slots are taken and shows in the figure as an example.

As shown in FIG. 2, the printed circuit board 100 includes a main body 120, a first insulation layer 140, and an anti-electromagnetic interference (EMI) coating 160. In an embodiment, the printed circuit board 100 is a multilayer printed circuit board.

The printed circuit board 120 includes at least a high-frequency signal transmission line 122. In an embodiment, the high-frequency signal transmission line 122 is a differential signal transmission line.

The first insulation layer 140 covers the main body 120 to protect traces on the main body 12, and the traces include the foregoing high-frequency signal transmission line 122. In an embodiment, the first insulation layer 140 is a solder mask layer.

The central processing unit slot 12 and the memory slot 14 are disposed on the main body 120 of the printed circuit board 100, and are electrically connected to the main body 120 of the printed circuit board 100. The central processing unit slot 12 is electrically connected to the memory slot 140 through the high-frequency signal transmission line 122 of the main body 120.

The anti-EMI coating 160 covers a predetermined area A of the first insulation layer 140. As shown in the figure, in an embodiment, the predetermined area A corresponds to a configuration location of the high-frequency signal transmission line 122. In an embodiment, as shown in FIG. 1, the predetermined area is located between the central processing unit slot 12 and the memory slot 14.

The anti-EMI coating 160 includes wave-absorption powders 162 and an adhesive material 166. In an embodiment, the wave-absorption powders 162 are conductive powers, such as iron, cobalt, nickel, or an alloy material thereof, or conductive powers with a wave-absorption function, such as silicon carbide (SiC) or a carbon black (CB) material. In an embodiment, the adhesive material 166 is a synthetic adhesive with an adhesive function, such as a thermosetting resin, photosetting resin, or a synthetic adhesive cured by volatilization. Still, in an embodiment, the anti-EMI coating 160 is wave-absorption powders 162 containing 90 to 95 percent by volume and a adhesive material 166 containing 5 to 10 percent by volume.

Figure 3:
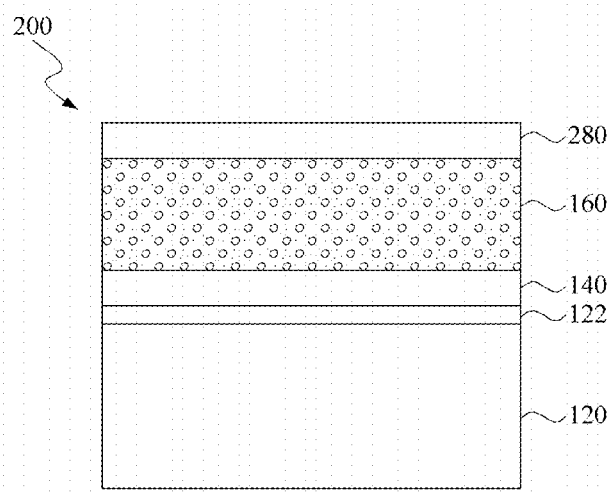
FIG. 3 is a cross-sectional schematic diagram of another embodiment of a printed circuit board according to the disclosure.

FIG. 3 is a cross-sectional schematic diagram of another embodiment of a printed circuit board according to the disclosure.

Compared with the embodiment in FIG. 1, a printed circuit board 200 of this embodiment further includes a second insulation layer 280. The second insulation layer 280 covers the anti-EMI coating 160. In other words, the anti-EMI coating 160 is disposed between the first insulation layer 140 and the second insulation layer 280. In an embodiment, the second insulation layer 280 is a solder mask layer.

In an embodiment, the second insulation layer 280 uses a same material and/or color as those/that of the first insulation layer 140 to hide the anti-EMI coating 160.

Figure 4:
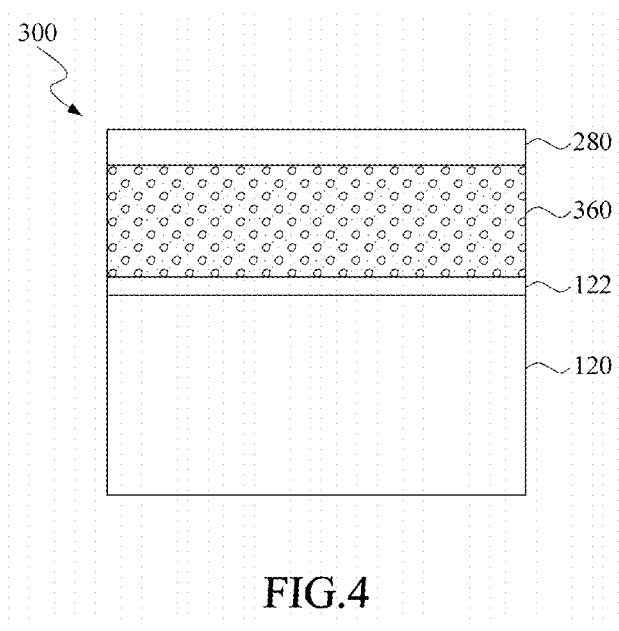
FIG. 4 is a cross-sectional schematic diagram of still another embodiment of a printed circuit board according to the disclosure.

FIG. 4 is a cross-sectional schematic diagram of still another embodiment of a printed circuit board according to the disclosure. Compared with the embodiment in FIG. 4, an anti-EMI coating 360 of a printed circuit board 300 of this embodiment is made of a non-conductive material. The anti-EMI coating 360 directly covers the main body 120 and covers the first insulation layer 140 on the main body 120.

FIG. 5 is a three-dimensional schematic diagram of another embodiment of a motherboard according to the disclosure. As shown in the figure, the motherboard 20 includes the printed circuit board 100, the central processing unit slot 12, at least a memory slot 14 (take two memory slots in the figure as an example), at least a busbar slot 28 (take two busbar slots in the figure as an example), and a motherboard control chip 26.

The central processing unit slot 12 and the memory slot 14 are disposed on the main body 120 of the printed circuit board 100, and are electrically connected to the main body 120 of the printed circuit board 100. The central processing unit slot 12 is electrically connected to the memory slot 140 through the main body 120. The busbar slot 28 and the motherboard control chip 26 are disposed on the main body 120, and are electrically connected to the main body 120. The busbar slot 28 is electrically connected to the motherboard control chip 26 through the main body 120.

Compared with the main body 10 in FIG. 1, a main body 20, in addition to applying an anti-EMI coating 160a on a predetermined area A1 between the central processing unit slot 12 and the memory slot 14, applies an anti-EMI coating 160b on a predetermined area A2 between the busbar slot 28 and the motherboard control chip 26.

A specific surface area of the printed circuit boards 100, 200, and 300 and the motherboards 10 and 20 that are provided by the disclosure are covered with the anti-EMI coatings 160, 160a, 160b, and 360, and the anti-EMI coatings include wave-absorption powders and the adhesive material. The wave-absorption powders absorb electromagnetic waves generated by the high-frequency signal transmission line 122, to prevent interference caused by a transmission signal on the printed circuit board to other electronic components.

The foregoing is only the preferred embodiments of the disclosure and is not intended to limit the disclosure. Equivalent replacement or variations made by any person of ordinary skill in the art in any form without departing from the scope of the technical means of the disclosure do not depart from the content of the technical means of the disclosure and still fall within the protection scope of the disclosure.

What is claimed is:

1. A printed circuit board, comprising:
a main body;
a first insulation layer, covering the main body and comprising a predetermined area;
a second insulation layer; and
an anti-electromagnetic interference (EMI) coating, covering the predetermined area and comprising wave-absorption powders and an adhesive material,
wherein the anti-EMI coating is disposed between the first insulation layer and the second insulation layer.

2. The printed circuit board according to claim 1, wherein the main body comprises at least a high-frequency signal transmission line and the predetermined area corresponds to a location of the high-frequency signal transmission line.

3. The printed circuit board according to claim 1, wherein the second insulation layer is a solder mask layer.

4. The printed circuit board according to claim 1, wherein the first insulation layer is a solder mask layer.

5. A motherboard, comprising:
a printed circuit board, comprising:
a main body;
a first insulation layer, covering the main body and comprising a predetermined area;
a second insulation layer; and
an anti-EMI coating, covering the predetermined area and comprising wave-absorption powders and an adhesive material;
a central processing unit slot, disposed on the main body, and
a memory slot, disposed on the main body,
wherein the anti-EMI coating is disposed between the first insulation layer and the second insulation layer.

6. The motherboard according to claim 5, wherein the predetermined area is located between the central processing unit slot and the memory slot.

7. The motherboard according to claim 5, further comprising: a busbar slot and a motherboard control chip, the busbar slot and the motherboard control chip are disposed on the main body, and the predetermined area is located between the busbar slot and the motherboard control chip.

8. The motherboard according to claim 5, wherein the main body comprises at least a high-frequency signal transmission line, and the predetermined area corresponds to a location of the high-frequency signal transmission line.

9. The motherboard according to claim 5, wherein the second insulation layer covers the anti-EMI coating.

\* \* \* \* \*